United States Patent [19]

Araps et al.

[11] Patent Number: 4,622,383

[45] Date of Patent: Nov. 11, 1986

[54] METHOD FOR THE FRACTIONATION OF REACTIVE TERMINATED POLYMERIZABLE OLIGOMERS

[75] Inventors: Constance J. Araps, Wappingers Falls; Steven M. Kandetzke, Fishkill; Mark A. Takacs, Poughkeepsie, all of N.Y.

[73] Assignee: International Business Machines Corporation, Armonk, N.Y.

[21] Appl. No.: 759,630

[22] Filed: Jul. 26, 1985

Related U.S. Application Data

[63] Continuation-in-part of Ser. No. 556,731, Nov. 30, 1983, abandoned, and a continuation-in-part of Ser. No. 556,734, Nov. 30, 1983, abandoned.

[51] Int. Cl.$^4$ ............ C08G 69/26; C08G 69/34
[52] U.S. Cl. ............................ 528/345; 528/353
[58] Field of Search ............ 528/345, 353, 491, 492, 528/493, 495, 496, 497, 498

[56] References Cited

U.S. PATENT DOCUMENTS

| | | | |
|---|---|---|---|
| 3,845,018 | 10/1974 | Bilow et al. | 528/345 X |
| 4,097,456 | 6/1978 | Barie | 528/345 X |
| 4,168,366 | 9/1979 | D'Alelio | 528/353 X |
| 4,206,106 | 6/1980 | Heilman et al. | 528/353 X |
| 4,218,555 | 8/1980 | Antonoplos et al. | 528/353 X |
| 4,276,407 | 6/1981 | Bilow et al. | 528/353 X |
| 4,307,220 | 12/1981 | Lucarelli et al. | 528/353 X |
| 4,480,088 | 10/1984 | Pike | 528/353 |

*Primary Examiner*—Lucille M. Phynes
*Attorney, Agent, or Firm*—Perman & Green

[57] ABSTRACT

Acetylene or vinyl-terminated polymerizable oligomers of polyamic acid are fractionated to obtain an oligomer product having a molecular weight in the range of 2,000 to 4,000 which exhibits improved wetting and film forming properties. Fractionization is accomplished by dissolving the unfractionated polymerizable oligomer in a solvent in which the desired molecular weight fraction is soluble. The oligomer solution is passed through a filter which removes undissolved material having a molecular weight in excess of the desired molecular weight range. The filtrate is admixed with a hydrocarbon to precipitate the desired molecular weight fraction. Thereafter the collected solids can be redissolved in a ketonic solvent and the fractionation procedure repeated to further improve the molecular weight content of the fractionated oligomer.

10 Claims, No Drawings

METHOD FOR THE FRACTIONATION OF REACTIVE TERMINATED POLYMERIZABLE OLIGOMERS

BACKGROUND OF THE INVENTION

This invention is a continuation-in-part of the now abandoned U.S. Pat. Nos. 556,731 and 556,734, both filed Nov. 30, 1983, both now abandoned, which respectively are file wrapper continuation application U.S. Pat. Nos. 839,456 and 839,449, both filed Mar. 11, 1986.

The present invention relates to a method of fractionation of acetylenic or olefinic-terminated polyamic acid polymerizable oligomers.

There is a significant interest in the semi-conductor industry in replacing traditional inorganic dielectric materials with polymeric materials for device dielectric isolation layers, deep device dielectric isolation, inter-level metal passivation, etc. Polymeric materials are less expensive, can be more easily purified and fabricated, and potentially have better thermal and electrical characteristics than some inorganic counterparts.

U.S. Pat. No. 4,347,306 to Takeda et al discloses a method for manufacturing electronic devices having a multilayer wiring structure using a polyimide dielectric material between the layers. The polyimide dielectric material is a vinyl or acetylenic end-capped polymerizable polyimide oligomer which possesses imide rings in recurring units and a degree of polymerization which increases when cured due to the radical reaction of the end group or groups thereof. Acetylenic or olefinic end capped polyamic acid polymerizable oligomers which are the subject of the present invention differ in structure, have superior properties and can be cured by a different method from that disclosed in Takeda et al.

The following U.S. patents disclose polyimides polyimide-polyamides or like materials used as insulating or passivating materials in electronic components. However, none of the materials disclosed are equivalent acetylinic or olefinic terminated end capped polymerizable oligomers. U.S. Pat. Nos. 3,700,497 Epifano et al; 3,846,166 Saiki et al; 3,486,934 Bond; 3,515,585 Chamberlin et al; 3,985,597 Zielinski; 4,367,119 Logan et al. These patents are incorporated by reference, as is the earlier Takeda et al patent, since the acetylinic or olefinic terminated polyamic acid 20 polymerizable oligomers of the present invention can be used as a substitute for the polyimide and related materials disclosed in these references.

Copending U.S. patent application Ser. Nos. 556,731 and 556,734 disclose and claim methods for forming a thin film of a dielectric material on an electronic component and for filling deep dielectric isolation trenches or cavities, respectively, wherein there is deposited on the substrate a layer of a polymerizable oligomer selected from polyamic acids, the corresponding polyamic esters, the corresponding polyisoimides, and the corresponding polyimides (thin film formation only) or mixtures thereof, the end groups of the polymerizable oligomer being end-capped with a vinyl or acetylenic end group. The deposited layer is catalytically cured under conditions whereby the resulting cured polyimide exhibits low extrinsic and intrinsic stress when a thin film is formed. A thermal cure can be used when filling deep dielectric isolation trenches.

Examples of polymerizable oligomers of the type described in application Ser. Nos. 556,731 and 556,734 are represented by the formulae:

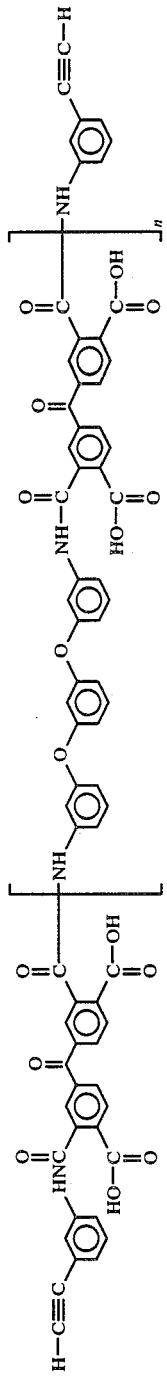
FORMULA 1
POLY(AMIC ACID)
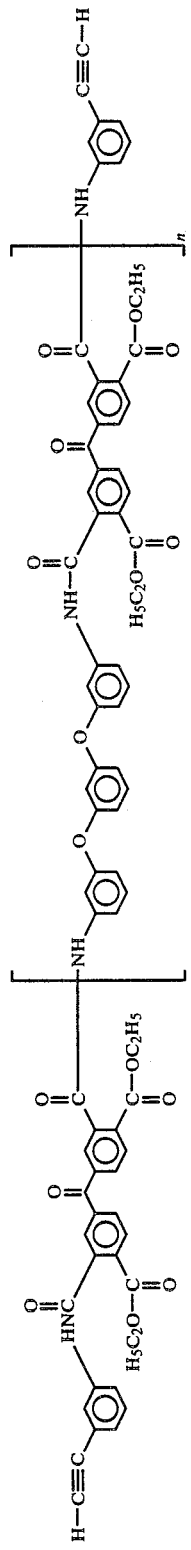
FORMULA 2
POLY(AMIC ESTER)
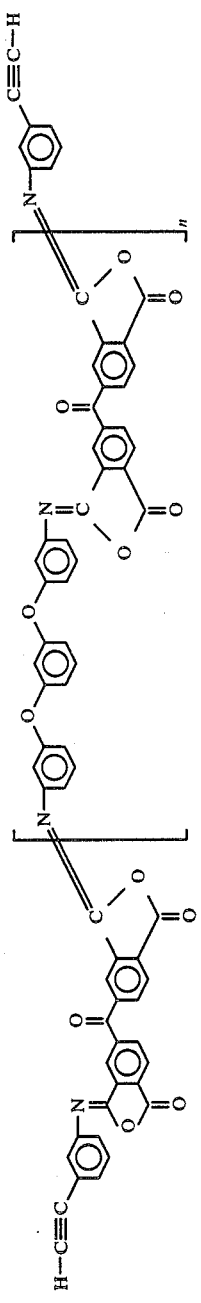
FORMULA 3
POLY(ISOIMIDE)
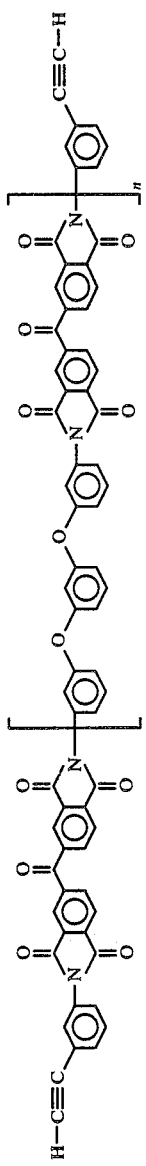
FORMULA 4
POLY(IMIDE)

wherein the terminating end group may be C≡C as shown above or C=C.

The isoimide of formula 3 as received is pre-cyclized from the amic acid of formula 1. The isoimide of formula 3 is kinetically preferred for the formation of thin dielectric films but the imide of formula 4 is thermodynamically preferred as it is more stable and is, therefore, obtained upon heating either the amic acid of formula 1 or the isoimide of formula 3.

The polymerizable oligomers which have formula 3 (the isoimide) are preferred to the polyamic acid oligomer of formula 1 or the polyimide oligomer of formula 4 for the following reasons.

The isoimide has a high degree of solubility, comparable to the amic acid; both of these materials will form concentrated solutions (as high as 55% by weight oligomer) suitable for spin coating in ketonic solvents as well as NMP. The ketonic solvents appear to improve wetting and film forming properties. The imide analogue, however, dissolves only in NMP and only to concentrations less than 20% by weight.

The polyisoimide of formula 3 softens at about 160° C., below the onset of imidization (190° C.; 6 minutes) and this capacity to soften before imidization and cross-linking occurs should result in superior planarization and film uniformity. The polyimide and polyamic acid oligomers soften at above 190° C. However, the ability of the polyamic acid oligomer to form concentrated solids solutions results in less shrinkage on cure and thus better planarization than can be obtained using the low concentration polyimides oligomer solution.

The polyisoimide rearranges thermally to yield a cross-linked imide without the evolution of water or alcohol. This is a substantial benefit since water is tenaciously bound in polyimides and is not completely removed until samples are heated at 350° C., or above, for a minimum of 30 minutes. Continuous outgassing of solvent (NMP) and water during cure could result in undesirable porosity and pin-holes.

As used herein, the term "polymerizable oligomer" includes within its meaning acetylinic or olefinic (vinyl) end capped polyamic acid, the corresponding polyamic ester, the corresponding polyisoimide, the corresponding polyimide, or mixtures thereof. The cured polyimides which are derived from these polymerizable oligomers by thermal, radiation or catalytic curing are cross-linked three dimensional products as distinguished from the two-dimensional products derived by curing the condensation type, linear polyimide materials disclosed in the U.S. patent references discussed above.

The polymerizable oligomers described in application Ser. Nos. 556,731 and 556,734 are soluble in common organic solvents, for example, alcohols, ketones, ethers, amides, etc., a typical exemplary solvent being N-methyl pyrrolidinone (NMP). Since they are substituted with reactive terminae they can be cured to yield the desired dielectric and/or passivation material in situ to provide a strong three-dimensional network which provides the desired cured polyimide of high molecular weight and good thermal and chemical properties (as opposed to conventional polyimides of the prior art which cure to yield a two-dimensional network).

Mixtures of solvents can be used to prepare casting solutions of the polymerizable oligomer if desired. We have determined that lower solution viscosities can be obtained by using solvent mixtures such as diglyme/paraxylene or NMP/xylene. In such cases, a mixture of compatible solvents should include at least one good solvent for the oligomers, preferably an ether.

The polymerizable oligomers can be fully cured by heating at 0.5 hours at 200° C., 0.5 hours at 300° C. and 4 hours at 400° C., with all curing above 85° C. being done under nitrogen. After cure, continued exposure to 400° C. (under thermogravimetric analysis) results in a consistent low rate of weight loss equal to or less than 0.12 wt.%/hour. The curing cycle to be used depends on the application. Preferred cure cycles for forming a thin film dielectric are described in U.S. patent application Ser. No. 556,731 and preferred cure cycles for filling deep dielectric isolation trenches are described in U.S. patent application Ser. No. 556,734.

It is understood that the term "polymerizable oligomers" includes within its meaning copolymers of the oligomers. An example of such a copolymer would be the polymerization product of an acetylene terminated oligomer with triethynyl benzene. Such copolymers are expected to have a higher module due to the presence of polytriethynyl benzene regions and are expected to have higher thermal and hydrolytic stability. The reduction in imide content would also reduce the susceptability of the cured polyimide to absorb water and popular solvents.

Upon heating (150°–300° C.) the polymerizable oligomers of the present invention undergo three types of reactions: imidization via dehydration of the amic acid or elimination of alcohol from the amic ester functionalities and thermal rearrangement of the isoimide to yield the imide and radically induced addition reactions of the reactive terminal groups, be they vinyl or acetylinic end groups. The terminal end groups can add to other terminal end groups generating cross-links at chain ends or may react with carbonyl groups contained within the polyimide chain. These addition reactions deactivate the requisite reactive functional groups and generate the desired three dimensional polymer network in the cured polyimide. As earlier noted, conventional linear polyimide resins undergo imidization upon heating and result in a two-dimensional network.

As one skilled in the art will appreciate, the molecular weights of the polymerizable oligomers will have a variability in useful molecular weights depending upon the exact polymerizable oligomer selected, the solvent selected, the desire or non-desire to use multiple polymerizable oligomer applications, the desire or non-desire to have low solvent concentrations and like considerations as will be apparent to one skilled in the art. However, for most commercial process line operations, it is contemplated that useful polymerizable oligomers will have a weight average molecular weight in the range of from about 1,500 to about 30,000 as determined by Gel Permeation Chromatograph (GPC) (herein molecular weights are on the same basis unless otherwise indicated).

For use in the formation of thin films on electronic components, it is preferred that the polymerizable oligomers of the present invention have a molecular weight of about 2000 to about 4000, and most preferably about 2500 to 3000.

When originally synthesized, the polymerizable oligomer may have an undesirably wide molecular weight range. Polymerizable oligomers end-capped with a vinyl or acetylinic end group are commercially available under the trademark Thermid from the National Starch and Chemical Corporation. The Thermid polymers include LR-600 (polyamic acid), AL-600 (polyamic ester), IP-600 (polyisoimide) and MC-600 (polyimide). As obtained, they typically have a molecular weight on the order from about 600 to about 30,000 determined by GPC. For example, as received, Thermid LR-600 polyamic acid of formula 1 has a molecular weight range of from about 600 to about 10,000 (vendor information). This polymerizable oligomer also contains a small amount of a gel fraction that appears on all GPC analysis as a high molecular weight fraction, e.g., on the order of 3,000,000. It has been determined that to obtain excellent wetting and film forming properties, it is necessary that this commercial polymerizable oligomer be fractionated to remove both the high and low molecular weight components, leaving a molecular weight fraction on the order of about 2,000 to about 4,000 (GPC analysis), substantially removing the gel fraction.

SUMMARY OF THE INVENTION

In accordance with the present invention, acetylene or vinyl-terminated polymerizable polyamic acid oligomers are fractionated to obtain an oligomer product having a molecular weight in the range of about 2,000 to about 4,000, the fractionated oligomer exhibiting improved wetting and film forming properties as compared to the as received commercially available material and providing defect-free smooth films. The fractionization of the oligomer is accomplished in accordance with a process wherein the polymerizable oligomer to be separated into the desired molecular weight fraction is dissolved in a solvent or mixture of solvents in which the desired molecular weight fraction is soluble. The solution of the polymerizable oligomer is passed through a filter which is capable of removing undissolved material having a molecular weight in excess of the desired molecular weight range. The filtrate obtained is admixed with an aromatic hydrocarbon such as toluene, to precipitate the desired molecular weight fraction. Thereafter, the collected solids can be even further purified by dissolving them in a ketonic solvent such as acetone; passing the ketonic solution through a filter which removes undissolved oligomer having a molecular weight in excess of the desired molecular weight range; and reprecipitating into an aromatic hydrocarbon. The reprecipitated solids having the desired molecular weight range are separated from the solution and dried.

The fractionated product can be dissolved in a variety of solvents paticularly NMP and acetone, and exhibits improved wetting and film forming properties as compared to the unfractionated commercially available material, providing defect-free smooth films.

Fractionation also reduced the ionic content of the polymerizable oligomer and removes unreacted monomers which might contaminate the oligomer and reduce its thermal stability.

DETAILED DESCRIPTION OF THE INVENTION

To fractionate the vinyl or acetylene end-capped polymerizable oligomers of the present invention into the desired molecular weight fraction, the unfractionated polymerizable oligomer is first dissolved in a suitable solvent or mixture of solvents. For example, the polymerizable oligomer can be dissolved in an aprotic solvent such as n-methyl-2-pyrrolidinone, dimethylsulfoxide, dimethylacetamide, dimethylform-amide, bis-2-methoxy ethyl ether (diglyme), tetrahydrofuran, triglime or tetraglyme, any of which are good solvents for the oligomer. Then a moderately good solvent for the oligomer can be added, such as (for example) methyl isobutylketone, acetone, acetophenone or isophorone, followed by a non solvent such as (for example) ethyl or alcohol, propyl alcohol, and isopropyl alcohol; short chain aliphatic alcohols are preferred. In the alternative, it is possible to combine one solvent from each grouping, i.e. one good solvent, one moderately good solvent and one nonsolvent, into a mixture and then add the polymerizable oligomer to be fractionated to the mixture of solvents.

It is preferred in the fractionation process of the present invention, that where possible, the combination of solvents used be the lowest cost combination. A preferred solvent combination for initially dissolving and fractionating the polymerizable oligomer is composed of N-methyl-2-pyrrolidinone (NMP), 4-methyl, 2-petanone (methyl isobutyl ketone) and methanol, wherein the good solvent (NMP) comprises from about 10% to about 20% of the combination, the moderately good solvent (methyl isobutylketone) comprises from about 35% to about 45% of the combination, and the nonsolvent (methanol) comprises from about 40% to about 50% of the combination.

The polymerizable oligomer to be fractionated is dissolved in the good solvent or the mixture of solvents with stirred agitation, e.g. 100–1000 rpm at a concentration of about 40% to about 60% by weight in the good solvent or about 5% to about 20% by weight in the mixture of solvents. In either case, after addition of all solvents and the polymerizable oligomer, the polymerizable oligomer comprises, preferably, about 10 to about 15 percent by weight based on the total weight of the solution. The preferred concentration of polymerizable oligomer solids provides the most efficient workable viscosity for the steps of the fractionation process of the present invention.

An example of a typical resulting combination of solvents comprises of from about 10% to about 20% by weight by an amide such as N-methyl-2-pyrrolidinone, about 25% to about 45% by weight of a ketone such as 4-methyl, 2-pentanone and about 40 to about 50% by weight of an alcohol such as methyl alcohol.

The solution of the polymerizable oligomer of the present invention is then delivered to the inlet of a vessel pressurized to about 15 to about 25 psi with an inert gas such as nitrogen. A filter which is capable of removing polymerizable oligomers having a molecular weight in excess of about 4000 is connected to the outlet of the pressure vessel. Filters suitable for this purpose have particle size of about 0.2 micrometer to 0.5 micrometer and are generally formed of Teflon. The solution of polymerizable oligomer is passed through the filter under pressure to the inlet of a second vessel to filter out any undissolved solid oligomer fraction having a molecular weight in excess of 4000. The remaining polymerizable oligomer fraction having a molecular weight less than 4000, which is contained in the filtrate passed into the second vessel, is then precipitated by the addition thereto, with stirring, of about 35 to about 60 percent by weight based on the weight of the filtrate of an aromatic hydrocarbon such as toluene, paraxylene, metaxylene or orthoxylene. The aromatic hydrocarbon is then mixed with the filtrate for about 0.5 to 5 hours to effect precipitation of the desired polymerizable oligomer molecular weight fraction. Note that it may be possible to use a nonaromatic solvent such as an aliphatic solvent or cyclohexane, but the aromatic solvents are preferred due to vapor pressure/boiling characteristics. The second vessel is also pressurized with an inert gas such as nitrogen, and the liquid mixture is passed at about 10 to 25 psi through the outlet of the second vessel to a third vessel, the outlet of the second vessel also being provided with a filter of 0.2 micrometer to 0.5 micrometer size. The tan, or straw-colored precipitate which is formed on the filter of the second vessel outlet is dried overnight at ambient conditions. If desired, to insure the complete removal from the desired molecular weight fraction of polymerizable oligomers having a molecular weight outside the desired molecular weight range, the precipitate may be redissolved in a ketonic solvent such as acetone, and reprecipitated with an aromatic hydrocarbon such as toluene in the manner already set forth. The yield of polymerizable oligomer having a molecular weight of about 2000 to 4000 obtained by the fractionation process of the present invention generally is in the order of about 45%.

To prepare coating solutions from the fractionated polymerized oligomer of the present invention, the fractionated oligomer is dissolved in a suitable solvent such as NMP, or acetone at a concentration of about 25% to about 40% based on the weight of the solution and then passed through a filter of about 0.2 micron size to further insure that any polymerizable oligomer outside the desired 2000–4000 molecular weight range has been removed.

The polymerizable polyamic acid oligomers fractionated in accordance with the process of the present invention having a molecular weight in the range of 2000–4000 provide the processing and planarizing advantages of a monomer yet the cured polyimide obtained upon curing (imidization and crosslinking) has the superior physical and chemical properties of a high molecular weight polymer.

The polymerizable oligomers of the present invention exhibit highly desirable characteristics for use in forming dielectric and/or passivation films or layers in electronic components, though these properties are primarily from the process viewpoint as opposed to the final device viewpoint since, in the final device, they are cured.

These highly desirable properties include the ability to be cured at low temperatures to yield a three-dimensional crosslinked network involving carbon-to-carbon crosslinking, thereby providing a cured polyimide polymer matrix that exhibits minimum stress at device operation temperatures.

Because of their low molecular weight, solutions of high solids content e.g. in the order of about 55% by weight can be prepared that are sufficiently fluid to coat surfaces of irregular topography using simple techniques which results in less solvent content and significantly less shrinkage and stress upon solvent evaporation.

The cured polyimide films derived from the fractionated polyamic acid polymerizable oligomers of the present invention contain essentially no voids, bubbles, non-wet areas, cracking or delamination.

The cured polyimide film exhibits a high degree of planarization, e.g., on the order of 95%.

The cured polyimide film can be uniformly etched back with no resultant residue.

The cured polyimide film exhibits excellent adhesion to various surfaces, such as metals as are conventionally used in semiconductor fabrication, inorganic materials as are conventionally used e.g., silicon, silicon dioxide, silicon nitride, and the like, after final cure.

The cured polyimide film is thermally stable to 400° C. exhibiting negligible outgassing after 10 hours at 400° C., no adhesion loss and no morphological changes. The cured polyimide does not exhibit any substantial weight loss before 400° C.

The cured polyimide film has excellent electrical properties, e.g., its dielectric constant does not change after exposure to water or thermal cycling and it is resistant to polarization and charge inversion.

The cured polyimide film exhibits excellent chemical resistance, e.g., it has a minimal tendency to absorb process solvents and the film does not swell or crack when exposed to metal lift-off solvents.

SOLUTION FORMATION

As indicated, the polymerizable oligomers of the present invention are most typically applied to the desired substrate in the form of a solution. Because of their low molecular weight as earlier indicated, solutions of high solids content, e.g., on the order of 50% to 60% by weight, can be prepared that are sufficiently fluid to coat surfaces of irregular topography and be easily planarized. Because of their low molecular weight, the polymerizable oligomer dissolves in ketones such as methy isobutyl ketone, ethers such as bis-2-methoxy ethyl ether (diglyme) amides such as N-methyl pyrrolidinone, etc., resulting in a solution which readily wets a variety of surfaces, e.g., metals, silicon nitride, ceramic surfaces, silicon oxides, etc.

For example, a solution of 45% by weight of the fractionated vinyl or acetylenic end-capped polyamic acid oligomer of the present invention has a viscosity of 300 cp as compared to a 40% solution of a conventional polyamic acid, which contains no vinyl or acetylenic end-caps, which has a viscosity of 50–80 kcp. Note also that the Thermid oligomers previously described are principally meta orientation amine functionality oligomers. The meta x amine functionality is preferred over the para orientation amine functionality which comprises the majority of conventional polyamides. The ability to coat with a concentrated polymerizable oligomer solution results in a low solvent content and significantly less shrinkage and stress upon solvent evaporation.

The polymerizable oligomer solution can be coated by conventional methods such as spin coating, spray coating, meniscus coating, etc.

These solutions are prepared merely by blending the polymerizable oligomer or mixtures thereof with the desired solvent or mixtures thereof, and thereafter coating and optionally drying the same, usually at less than about 100° C. for about ½ to 2 hours, usually about 1 hour. The temperature of drying is important, since it is normally desirable that the solvent be driven off without initiating any substantial degree of cross-linking. Inert atmospheres are used in order to avoid undesirable reactions during drying.

It is to be noted that a separate drying step is not mandatory and if desired, a combined dry/cure cycle can be used as later explained.

In case of device dielectric isolation layers, the thickness of the dry polymerizable oligomer film or layer is not critical so long as the final cured polyimide exhibits its desired dielectric and/or passivating function, and is typically on the order of thicknesses as have been used for polyimides in the prior art to achieve this function.

Without being limitative in any fashion, typical thicknesses are on the order of about 1 micron to about 15 microns.

In the case of deep device dielectric isolation, the isolation trenches or substrate geometrical cavities to be filled are typically 2 to 5 microns in width by 4 to 7 microns in depth, with considerable variation in length.

CURING CONDITIONS

In the case of device dielectric isolation layers, after the dried polymerizable oligomer film or layer is formed, the next active processing step with respect to the polymerizable oligomer is curing the same.

With respect to the solvent removal step, a slight amount of cross-linking during solvent removal is not unduly detrimental to the cured polyimide film of the present invention. However, since the polymerizable oligomers of the present invention tend to cross-link very rapidly once cross-linking conditions are reached, it is most preferred that substantially no cross-linking occur during solvent removal since volatilizing solvent might lead to voids, bubbles or the like. In order to minimize crosslinking, solvent removal is typically carried out below 100° C. With this background in mind, we now turn to the preferred curing conditions for device dielectric isolation layers which, of course, involve a catalytic cure.

As previously stated, the thin film dielectric or passivating layers, are typically thin films on the order of about 1 micron to about 15 microns. With such thin films, the stress generated during a high temperature cure leads to the problems earlier discussed in detail. While a thermal cure can be used to cure (crosslink) the polymerizable oligomers of the present invention, the stress problems earlier discussed can result. Accordingly, thermal curing the polymerizable oligomers of the present invention when used in then film form is not preferred, albeit for certain non-critical applications theoretically such might be useful.

Thus, while curing can be by a number of procedures, e.g., thermal, chemical or radiation curing or a combination thereof, for the reasons above, in the case of thin film dielectric or passivating layers, it is most preferred to cure catalytically since in this instance stresses are not generated in the cured polyimide film, which might be the case with a high temperature cure. This is one of the major advantage of using the polymerizable oligomers of the present invention, i.e., high temperatures cures are not necessary due to the reactive end groups. Theoretically radiation assisted cures might be considered the equivalent of catalytic cures, however, from a practical viewpoint the simplicity and low expense of catalytic cures is preferred. Radiation cures are discussed herein, however, since they also do not involve the problem with thermal cures per se with respect to stress.

In the case of catalytic cure any catalyst can be used which will cause three-dimensional cross-linking of the polymerizable oligomers of the present invention, and the amount of catalyst required is simply that which will enable the catalysis reaction to effectively proceed.

Normally, the catalyst or catalysts, if a stepped catalytic reaction is desired, is/are added to the solution of the polymerizable oligomer prior to coating the same.

The catalysts used per the present invention are conventional and can be freely selected from those in the prior art used to catalyze the crosslinking of monomers or oligomers to the cured polyimide form.

Useful catalysts include volatile peroxide catalysts such as benzoyl peroxide, decumyl peroxide, etc.

As indicated, catalyst proportions are not overly important so long as the desired catalytic effect is achieved. Normally, however, proportions are on the order of about 0.05 to about 10 weight percent based on the weight of the polymerizable oligomer in the film or layer thereof prior to curing.

One substantial advantage, as indicated, of using a catalyst is that curing can be effected at low temperatures. The temperature selected obviously must be one that would activate the catalyst involved. For the peroxide catalysts, this is typically on the order of about 180° C. to about 195° C. The time of curing is relatively unimportant when a catalyst is used since curing per se is very rapidly effected.

Again a combined dry/cure cycle is used. Primary drying is generally at a temperature where catalyst scission does not occur, e.g., about ½ to about 2 hours at a temperature lower than the catalyst scission temperature. Note in the Example about 40 minutes are spent at 170° C. or less. Thereafter the temperature is stepped to over the catalyst scission temperature, e.g., to over 200° C., typically 200°~300° C., normally for about 1 to about 2 hours. Of course, other curing cycles can be used.

As an alternative to heating such a catalytic system, ultraviolet radiation or electron beam radiation can be used to initiate the catalyst. Due to the relatively expensive equipment required for radiation induced catalysis, such is not preferred per the present invention. It is dicussed, however, for purposes of completeness. Conditions are selected in a conventional manner so as to initiate the catalyst. In any case, whether thermal, thermal-catalytic or radiation-catalytic reactions are used, the final cross-linked density of the cured polyimide film will depend, of course, on the amount of catalyst used and the ratio of polymer repeating units to end groups. Typically the end groups will comprise on the order of about 1 to about 2 wt.% of the total polymer.

By developing the polymer three-dimensional network at low temperatures, minimized film stress at operating temperature should result. Imidization can be completed by a combination of chemical dehydration and thermal annealing after crosslinking has occurred which should not result in a significant change in the intrinsic stress in the cured polyimide film.

In the case of deep device dielectric isolation or the filling of geometrical cavities upon or within the substrate, the polymerizable oligomer are thermally cured at temperatures as high as e.g., from about 400° C. to about 500° C. The polymer is in mechanical equilibrium at the elevated temperature where final cure is achieved but can be under considerable extrinsic and intrinsic stress at ambient temperature or at device use temperature, e.g., 20°-85° C. Conventional polyimide films cannot relax to relieve this stress since the polyimide is below its glass transition temperature (Tg on the order of 300°-400° C.). In addition, only polyimides of very long chain length and high molecular weight are resistant to cracking. The conventional prepolymerized/preimidized polyimide swell when exposed to process solvents, but do not readily dissolve in common process solvents used for coating and form poor films due to poor wetting properties.

However, the polymerizable oligomers described in the present specification can be dissolved at concentrations as high as 70% by weight in common process solvents. Thus, the amount of shrinkage and stress created upon thermal cure is greatly reduced. In addition, due to the three dimensional structure formed upon imidization, end to end chain linking, and cross linking, which occur during cure, the deep device dielectric is able to withstand stresses created within its geometric configuration—even though thermal cycling to temperatures as high as 500° C.

When a high temperature cure is acceptable, this will typically be a stepped cure where the initial step is basically for purposes of solvent removal, e.g., for about ½ to about 2 hours at less than about 100° C. whereafter curing is completed at a higher temperature, e.g., about 200° to about 400° C. for about 4–6 hours. The time between steps is not critical, but typically curing would be at 85° C. for 30 minutes, 170° V. for 1 hour, 200° C. for 1 hour (an optional 300° C. for 1 hour) and 400° C. for 4½ hours. After curing, the rate of cooling is relatively unimportant. An alternative cure cycle involves heating at 85° C. for 30 minutes, 170° C. for 1 hour, 200° C. for 1 hour (300° C. for 1 hour (this step is optional)) and 400° C. for 4½ hours. A post curing step at about 500° C. may be used in some cases in order to improve the properties of the cured polyimide. The time between steps can be rapid. After completion of curing, the cooling rate is unimportant. One skilled in the art will easily appreciate that other curing cycles can be used with success, but we have found the above curing cycles to offer excellent results. Note that use of a cure step between 160° C. and 190° C. improves planarization because the polymerizable oligomer can soften and flow before the onset of imidization and crosslinking. The atmosphere of curing is typically an inert gas, e.g., nitrogen, argon, etc., though other atmospheres could be used which would not degrade the polymerizable oligomer or the cured polyimide, e.g., air, vacuum etc.

The three-dimensional network resulting from controlled radical coupling and addition reactions of the polymerizable oligomers of the present invention is significantly more resistant to deformation and cracking than are the two-dimensional conventional polyimide structures.

The presence of inter-chain crosslinks should reduce the capability of the cured polyimide to outgas as a result of thermal degradation. Although bond scission will occur as a result of heating, fewer volatile groups are generated due to the presence of the crosslinks.

Due to the higher carbon content and greater polymer density after curing as compared to conventional polyimides, the cured polyimide of the present invention is significantly more hydrophobic than conventional polyimides. For example, after conditioning for 1,000 hours at 50° C. and 96% relative humidity, the cured polyimide of the present invention contained less than 1% water and no change in the dielectric constant thereof was observed.

It is to be noted that compounds represented by formula 1 and 2 can be imidized at room temperature by dehydration with dehydrating agents such as trifluoroacetic anhydride, acetic anhydride-acetic acid or dicyclohexyl carbodiimides and then cured by cross-linking the same as earlier described. The amic acid and esters can be initially catalytically cured and then imidized by such dehydration techniques after the 3-dimensional network has been formed.

Following curing, if it is desired or necessary to remove the cured polyimide of the present invention so as to planarize the surface thereof, this can be effected using a conventional reactive ion etching in a manner known in the art. Such is described in detail in "A Survey of Plasma-Etching Processes" by Richard L. Bersin, published in Solid State Technology, May 1976, pages 31–36, and "Reactive Ion Etching In Chlorinated Plasma" by Geraldine C. Schwartz et al, Solid State Technology, November, 1980, pages 85–91, both hereby incorporated by reference. Following the procedure of these publications, the cured polyimide of the present invention can be uniformly etched back with no resultant residue.

THE METALLURGY

The polymerizable oligomers of the present invention can be applied to any type of metallurgy as is conventionally used in electronic devices. We have encountered no problem with cured polyimide adhesion to any type of conventional metallurgy so long as, of course the curing conditions are appropriately selected.

Of course, metallurgy which is formed on the cured polyimide must not be formed at a temperature which would degrade the cured polyimide or cause substantial outgassing during metallurgy deposition.

The metallurgy may be formed in a conventional manner, e.g., vacuum evaporation, sputtering, etc.

Metallurgy thicknesses as are conventionally used in the art.

LITHOGRAPHIC PROCESSING

In many instances, it may be necessary or desirable to pattern the polymerizable oligomer or cured polyimide layer or film formed per the present invention.

In this situation, after the polymerizable oligomer or cured polyimide layer or film is formed at the desired thickness, a conventional photoresist is applied, exposed and developed (removed) in a conventional manner to yield the desired pattern, whereafter the photopolymerizable oligomer or cured polyimide is removed in a conventional manner, typically using solvents as are known in the art.

Exposure and development of the photoresist is typically following vendor's instructions

SUBSEQUENT PROCESSING

As one skilled in the art will appreciate, after a cured polyimide layer or film is formed per the present invention, additional layers of metallurgy or other conventional layers as are used in the semi-conductor arts can be applied to the cured polyimide and processed as desired.

Since such processing steps are conventional, they will not be recited here in detail. For example, assuming that a first layer of metallurgy is formed and the cured polyimide layer of the present invention is formed thereon, a second layer of metallurgy could be formed on the cured polyimide layer in electrical connection through the openings in the cured polyimide layer (generated by the photoresist technique above) to the first metallurgy layer.

Thereafter, an additional layer or film of cured polyimide per the present invention could be formed on the metallurgy, processed as above, and further processing sequences conducted a number of times to build a multi-level structure where dielectric separation or isolation is achieved using the cured polyimide of the present invention.

Layers can also, of course, be passivated as desired in a conventional manner. Note that due to the thermal stability of the polyimide formed upon cure of the oligomers of the present invention, it is possible to cover the polyimide layer with a layer of an inorganic dielectric without encountering thermal-mechanical stability problems during processing nor during device performance conditions.

In essence, the above steps can be repeated a plurality of times until the desired device levels are obtained, typically levels of metallurgy, separated by the cured polyimide of the present invention.

Having thus generally described the invention, the following working examples are offered to illustrate the same.

EXAMPLE I

The polymerizable oligomer selected was Thermid IP-600 (the isoimide). It was obtained in powder form and had a molecular weight on the order of about 2,000 to about 4,000.

It was dissolved in NMP at ambient to provide a spinning or casting solution containing 30 weight percent of the isoimide based on solution weight.

For purposes of illustration, the substrate selected was silicon dioxide. This is a conventional semiconductor substrate. Of course, the isoimide could also be used as a direct replacement for the polyimide material of the earlier incorporated by reference Takeda et al patent.

A layer of typical metallurgy as is used in the art, in this case, Al-Cu (98 weight percent:2 weight percent) was formed on the silicon dioxide substrate in a conventional manner by standard vacuum evaporation.

The metallurgy was then patterned in a conventional manner using a standard positive photoresist following the vendor's instructions, thereby forming a metallurgical pattern on the silicon dioxide substrate.

The isoimide solution (earlier formed as indicated above at ambient conditions) was spun onto the patterned metallurgy to a thickness of 2–5 microns.

No drying step was used, rather, a combined dry-/cure step was used in an inert atmosphere, specifically nitrogen.

The time of temperature elevation was not important and was merely the time necessary to raise the atmosphere in the dry/cure furnace used from one temperature to the next. The times and temperatures were (starting at ambient): 85° C., 10 minutes; 170° C., one-half hour; 200° C., one-half hour; 300° C., one-half hour; and 400° C., 4 and one-half hours. No catalyst was used, i.e., in this particular instance a straight thermal cure was used.

As earlier indicated, however, this can lead to substantial stress problems and is not preferred.

Accordingly, the above procedure was duplicated except that instead of using a straight thermal cure, a catalytic cure was used. Specifically, about 5 weight percent based on the weight of the isoimide of dicumyl peroxide was mixed at ambient temperature with the isoimide and NMP to form the spinning solution.

Again, a combined dry/cure was used at the following conditions 85° C., 10 minutes; 170° C., one-half hour; 200° C., one hour; 250° C., one hour.

As earlier indicated, the major reason for using the relatively long times, be it in the case of a thermal cure or a catalytic cure, the time of course being shorter with a catalytic cure, is to ensure essentially complete solvent drive-off. If a separate drying step is used, substantially lesser times are required for a thermal cure or a catalytic cure.

Following processing as above, the device intermediate was removed from the furnace and permitted to cool in the air at ambient conditions.

Conditions of cooling are important, and the cooling rate should not be so fast that any device component would crack or the like, but this will be apparent to one skilled in the art.

EXAMPLE II

The polymerizable oligomer selected was Thermid LR-600 (polyamic acid). It was obtained from the vendor in solution form and had a molecular weight in the order of about 600 to about 10,000.

The Thermid LR-600 was fractionated to obtain a polymerizable oligomer having a molecular weight on the order of about 2500 to about 3000 by first adding to a 20 liter mixing vessel equipped with a stirrer:

1.6 kilograms (kg) N-methyl-2-pyrrolidinone,
5.0 kg 4-methyl-2-petanone,
6.0 kg methanol and
4.5 kg amic acid (50% solids in the supplied solution).

The admixture was mixed for one hour at 500 to 1000 rpm. The resultant solution was then passed into the inlet of a first 20 liter stainless steel pressure vessel, the outlet of which was provided with one-micron particle size filter. The pressure vessel was pressurized to 15 psig nitrogen gas pressure whereby the solution was passed from the first pressure vessel to a second 120 liter vessel containing 80 kg toluene. The material in the 120 liter vessel was stirred constantly during transfer of the solution from the first pressure vessel to the 120 liter vessel; stirring was continued for a few minutes after transfer. Subsequently, the mixture in the 120 liter vessel was allowed to stand without agitation for a period of about two hours, during which a highly viscous dark-colored material formed in the bottom of the vessel. The upper liquid was decanted and removed from the second, 120 liter vessel. Twenty-four liters of acetone were added to the second vessel to redissolve the high viscous material. The acetone solution containing the redissolved viscous material was passed into the inlet of a third 60 liter stainless steel pressure vessel, having an outlet equipped with a 1 micron filter. The third pressure vessel was pressurized to 15 psig with nitrogen gas to transfer the solution from the outlet of the third vessel into a fourth stirred 120 liter vessel containing 75 kg. toluene over a one-hour period.

The solids deposited on the 1 micron filter of the third vessel were collected and then dried overnight at ambient conditions. The yield of polyamic acid was determined to be 30%. The dried solids were determined by GPC (Sephadex columns) to have a number average molecular weight in the range of about 2500–3000.

The so fractionated polyamic acid was dissolved in NMP to provide a film casting solution containing 45 weight percent of the polyamic acid based on solution weight.

An adhesion promoter, 3-amino propyl-triethoxy silane, was applied to the clean $Si_3N_4$ surface of a wafer using standard spin coating techniques. Subsequently, the casting solution of the polyamic acid oligomer was spun coated onto the wafer surface. The coated wafer was baked at 85° C. for 1 hour to evaporate the solvent and cure was achieved using a thermally stepped cure of 0.5 hours at 1702° C., 0.5 hours at 200° C., 0.5 hours at 300° C. and 4.5 hours at 400° C., to form films of 2–5 microns thickness. The spun solutions readily wetted the $Si_3N_4$ surface. The cured films were found to be so strongly adhered to this surface that the film could not be peeled or pulled from the surface.

By way of contrast when it was attempted to spin cast a solution of 45% by weight unfractionated Thermid LR-600, obtained directly from the vendor, the solution responded sutophobically, i.e., the solution spontaneously dewetted to form a useless, hemispherical globule at the wafer center.

The fractionated polyamic acid was used with excellent results as a deep dielectric (trench) fill material. NMP solutions containing 35% by weight of the fractionated polyamic acid were spun onto trenched structures and heated stepwise, e.g., 0.5 hours at 85° C., 0.5 hours at 170° C., 0.5 hours at 200° C., 0.5 hours at 300° C. and 4 hours at 400° C. in a nitrogen atmosphere to effect full cure. Examination of photomicrographs of cross-sections of the trenches structures indicated trenches with no voids and excellent local planarization (>95°) after two applications of the coating solution, wherein about 1.3 micrometers of thickness were deposited per application. Note, more than 2 applications may be necessary, depending on the size of the cavities in or upon the substrate which must be filled.

Examination of photomicrographs of the wafer surface after plasma etchback of the deposited films indicated that the reactive ion etching was uniform and did not result in any residues.

While specific components of the present system are defined above, many other variables may be introduced which may in any way affect, enhance, or otherwise improve the system of the present invention. These are intended to be included herein.

Although variations are shown in the present application, many modifications and ramifications will occur to those skilled in the art upon a reading of the present disclosure. These, too, are intended to be included herein.

We claim:

1. A method for fractionating a polyamic acid polymerizable oligomer to obtain an oligomeric product having a molecular weight in the range of about 2,000 to about 4,000, wherein the end groups of the polyamic acid polymerizable oligomer are end capped with a vinyl or acetylinic end group, the process comprising:
   (a) dissolving the polymerizable oligomer to be fractionated in a solvent in which the desired molecular weight fraction is soluble to prepare an oligomer solution,
   (b) passing the oligomer solution through a filter which removes undissolved material having a molecular weight in excess of the desired molecular weight range,
   (c) collecting an oligomer filtrate and admixing the filtrate with an hydrocarbon to precipitate the desired molecular weight fraction and then
   (d) collecting the precipitate of desired molecular weight fraction.

2. The method of claim 1 wherein the collected precipitate is dissolved in a ketonic solvent to obtain a solution of the precipitate, the solution of precipitate is passed through a filter which removes undissolved material having a molecular weight in excess of 4,000, an oligomer filtrate is collected and admixed with an aromatic hydrocarbon to precipitate a polymerizable oligomer having a molecular weight in the range of about 2,000 to about 4,000 which is then collected.

3. The method of claim 1 wherein the polymerizable oligomer is an acetylene end capped polyamic acid.

4. The method of claim 1 wherein the polymerizable oligomer to be fractionated is dissolved in a mixture of N-methyl pyrrolidinone, 4-methyl-2-petanone and methanol.

5. The method of claim 4 wherein the concentration of the N-methyl pyrrolidinone is about 10 to about 20 percent by weight, the concentration of the 4-methyl-2-pentanone is about 35 to about 45 percent by weight and the concentration of the methanol is about 40 to about 50 percent by weight.

6. The method of claim 1 wherein the polymerizable oligomer to be fractionated is dissolved in the solvent at a concentration of about 10 to about 15 weight percent.

7. The method of claim 1 wherein the filter is 1 micron in thickness.

8. The method of claim 1 wherein the polymerizable oligomer is precipitated from the filtrate with a hydrocarbon.

9. The method of claim 8 wherein the hydrocarbon is toluene.

10. The method of claim 2 wherein the ketonic solvent is acetone.

* * * * *